United States Patent [19]
Bothra et al.

[11] Patent Number: 6,057,224
[45] Date of Patent: *May 2, 2000

[54] METHODS FOR MAKING SEMICONDUCTOR DEVICES HAVING AIR DIELECTRIC INTERCONNECT STRUCTURES

[75] Inventors: Subhas Bothra; Ling Q. Qian, both of San Jose, Calif.

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/899,531

[22] Filed: Jul. 24, 1997

Related U.S. Application Data

[63] Continuation-in-part of application No. 08/623,883, Mar. 29, 1996.

[51] Int. Cl.[7] .......................... H01L 21/44; H01L 21/461
[52] U.S. Cl. ........................ 438/619; 438/622; 438/624; 438/627; 438/637; 438/691; 438/926
[58] Field of Search .................................. 438/619, 622, 438/624, 627, 706, 637, 691, 183, 926

[56] References Cited

U.S. PATENT DOCUMENTS

| | | | |
|---|---|---|---|
| 4,561,173 | 12/1985 | Te Velde | 438/619 |
| 5,117,276 | 5/1992 | Thomas et al. | 357/71 |
| 5,141,896 | 8/1992 | Katoh | 438/619 |
| 5,171,713 | 12/1992 | Matthews | 437/189 |
| 5,413,962 | 5/1995 | Lur et al. | 438/619 |
| 5,444,015 | 8/1995 | Aitken et al. | 438/619 |
| 5,530,280 | 6/1996 | White | 257/508 |
| 5,565,707 | 10/1996 | Colgan et al. | 257/762 |
| 5,567,982 | 10/1996 | Bartelink | 257/664 |

OTHER PUBLICATIONS

S. Bothra, B. Rogers, M. Kellam, and C.M. Osburn, "Analysis of the Effects of Scaling on Interconnect Delay in ULSI Circuits," IEEE Transactions on Electron Devices, vol. 40, No. 3, Mar. 1993.

M.E. Thomas, J.A. Saadat, and S. Sekigahama, "VLSI Multilevel Micro–Coaxial Interconnects for High Speed Devices," Fairchild Research Center, National Semiconductor Corp., Santa Clara, CA, CH2865–4/90/0000–0055 1990 IEEE.

*Primary Examiner*—John F. Niebling
*Assistant Examiner*—Hatran Nguyen
*Attorney, Agent, or Firm*—Martine Penilla & Kim, LLP

[57] ABSTRACT

A method of making an integrated circuit interconnect structure having air as the effective dielectric between metallization layers includes the steps of: a) providing an air dielectric formation layer of a sacrificial material over a substrate; b) forming a pillar holes in the air dielectric formation layer; c) filling the pillar holes with a non-sacrificial material; d) constructing a metallization layer over the sacrificial air dielectric formation layer and non-sacrificial material pillars; and e) applying an isotropic etchant to the interconnect structure to remove the sacrificial material, leaving the non-sacrificial material pillars for mechanical support of the metallization layer. An interconnect structure having an air dielectric includes a bottom metallization layer, a top metallization layer, and a plurality of pillars separating the bottom and top metallization layers and mechanically supporting the top metallization layer. Additional similar interconnect structures can be stacked over a base interconnect structure.

28 Claims, 7 Drawing Sheets

METHODS FOR MAKING SEMICONDUCTOR DEVICES HAVING AIR DIELECTRIC INTERCONNECT STRUCTURES

This is a Divisional application of copending prior application Ser. No. 08/623,883 filed on Mar. 29, 1996, the disclosure of which is incorporated herein by reference.

BACKGROUND OF THE INVENTION

The present invention relates generally to integrated circuits (IC) and, more particularly, to methods and structures that provide low dielectric constant interconnects for ICs.

Interconnect structures of ICs generally take the form of patterned metallization lines that are used to electrically interconnect devices and to provide interconnection with external circuitry. By way of example, IC devices may include metal oxide semiconductor ("MOS") devices having diffused source and drain regions separated by channel regions, and gates located over the channel regions. In practice, an IC chip may include thousands or millions of devices such as MOS transistors.

Conventionally, a dielectric layer is deposited over the devices and via holes are formed through the dielectric layer to the devices below. After the via holes are etched through the dielectric layer, a metallization layer is deposited over the dielectric surface filling the via holes with metal vias. After the first metallization layer has been deposited, it is patterned to form interconnect metallization lines. As is well known in the art, "patterning" may be accomplished by depositing a photoresist layer, selectively exposing the photoresist to light, developing the photoresist to form an etch mask, and etching the exposed metallization to pattern the metallization layer, and removing the etch mask. This process may then be repeated if additional layers of metallization lines are desired.

As the demand for faster, more complex and compact IC chips increases, the performance of the interconnects has become increasingly important. Although individual transistor speeds have continued to improve by implementing shorter gate lengths and less resistive gate electrodes, improvements in interconnect structure speed has lagged.

As is well known in the art, the speed of interconnect structures is generally characterized in terms of RC delays (i.e., resistance/capacitance timing delays). Therefore, efforts at reducing RC delays in interconnect structures have involved experimentation with dielectric materials to reduce capacitance and with metals to reduce resistance. As is well known in the art, different metals have different resistivities, and each have different IC fabrication benefits and drawbacks. By way of example, the resistance of copper (Cu) and silver (Ag) are relatively lower than aluminum (Al), but these metals are known to be more susceptible to corrosion. In addition, lowering the resistance of metal interconnect lines typically does not result in as great a benefit as reducing interconnect capacitance since all metals have relatively low resistance.

As is well known in the art, the capacitance associated with an interconnect structure is directly proportional to the dielectric constant ($\epsilon_o$) of the dielectric layer lying between the "plates" of the capacitor, i.e., adjacent metallization layers (i.e., $C \alpha \epsilon_o$). Therefore, interconnect capacitance may be reduced by lowering the dielectric constant of the material lying between metallization lines. Conventionally, silicon dioxide having a dielectric constant of about 4.0 is used to isolate the various interconnect metallization lines in IC chips. However, there have been various unsuccessful attempts at reducing capacitance by developing low dielectric materials. Such materials include organic-type dielectrics which have dielectric constants between about 2.0 and 4.0.

Unfortunately, the use of organic-type dielectrics present various fabrication difficulties. By way of example, fabrication difficulties may include excessive moisture uptake, increased susceptibility to sodium contamination, and a lack of global planarization schemes available to planarize organic-type dielectric materials. As a result, many IC manufactures avoid excessive cost and time consuming fabrication processes associated with organic-type dielectrics.

Air has a dielectric constant of about 1.0. Although it is well known that air has an extremely low dielectric constant, there are significant difficulties associated with constructing multi-level interconnect structures utilizing air as a dielectric including the complex task of providing mechanical support for stacked metallization layers during fabrication. As a result, in the past, fabricating interconnect structures with air as a dielectric (if at all possible) was prohibitively expensive as compared to the benefits of increased circuit speeds attributed to low dielectric constants.

FIGS. 1A and 1B represent a cross-sectional view and a top view, respectively of a prior art interconnect structure 12 having a suspended portion 14 over a silicon substrate 10. For a more detailed description of the steps associated with fabricating this prior art interconnect structure, reference may be made to a paper entitled "VLSI Multilevel Micro-Coaxial Interconnects for High Speed Devices" by M. E. Thomas, et al., Fairchild Research Center, National Semiconductor Corporation, Santa Clara, Calif., IEDM Tech. Dig., pages 55–58 (1990), which is hereby incorporated by reference. Interconnect structure 12 includes an inner conductor 20, a insulating dielectric coating 18 and an outer conductive layer that serves to encapsulate the insulating dielectric coating 18. Interconnect structure 12 also includes two contact posts 13 fabricated to have a larger dimension so as to support suspended portion 14.

It should be noted that the suspended portion 14 tends to sag under the influence of gravity. Therefore, there is a limit to the length of such structures before they fracture and break, which is a significant practical problem in implementing this prior art structure. Another problem encountered with the interconnect structure of FIG. 1A is the inability to stack multiple interconnect layers. By way of example, if a second interconnect structures were built over structure 12, the probability of breaking center region 14 dramatically increases due to the lack of mechanical support under center region 14.

A further disadvantage associated with coaxial interconnect lines, as in this prior art structure, is the inability to reduce their overall geometry. As shown in FIG. 1B, contact posts 13 are typically designed to have a larger base since they are primarily used for mechanical support. In addition,. fabricating coaxial interconnect lines is generally involves more processing steps which translates into expensive fabrication costs.

In view of the foregoing, what is needed is an interconnect structure that uses air as a dielectric, provides adequate mechanical support for one or more metallization layers, and does not require the implementation of expensive coaxial structures.

SUMMARY OF THE INVENTION

The present invention provides an integrated circuit structure having an air dielectric interconnect structure with excellent mechanical support between interconnect metallization layers. In addition, the interconnect structure of the present invention does not require expensive coaxial interconnect structures, nor does it necessarily increase the size of the interconnect structure.

A method of the present invention for making an interconnect structure having an air dielectric between metallization layers includes providing a silicon substrate having a plurality of active devices constructed thereon. Once the silicon substrate has been prepared, a air dielectric formation layer is deposited over the silicon substrate. A pillar mask is then formed over selected regions in the air dielectric formation layer in order to etch pillar holes. The pillar holes are then filled with a non-sacrificial material. Once the pillar holes are filled, a supported structure (e.g., a metallization layer) is constructed over the air dielectric formation layer and non-sacrificial material pillars. The process is then repeated if additional supported structures are required for interconnecting the various active devices on the silicon substrate. Preferably, the supported structures are patterned in order to provide at least one aperture to the air dielectric formation layer. An isotropic etchant is then applied to the interconnect structure such that the air dielectric formation layer is etched away leaving the non-sacrificial material pillars for mechanical support. In this manner, the resulting structure has an air dielectric region between the supported structures which results in increased interconnect speeds.

An interconnect structure of the present invention includes a substrate having an air dielectric formation layer over the substrate with a sacrificial material extending between a bottom and top surface of the air dielectric formation layer and regions of non-sacrificial material extending between the same bottom and top surfaces. A patterned supported layer (e.g., a metallization layer) is positioned over the air dielectric formation layer such that at least one opening extends to the sacrificial material. In this manner, a subsequently applied isotropic etchant may pass through the opening to remove the sacrificial material, leaving the remaining non-sacrificial material to form at least one pillar to mechanically support the supported layer. The air dielectric interconnect structure therefore provides excellent mechanical support for the supported layer while providing increased interconnect speeds.

These and other advantages of the present invention will become apparent upon reading the following detailed descriptions and studying the various figures of the drawings.

BRIEF DESCRIPTION OF THE DRAWINGS

FIG. 3A is a cross-sectional view of a substrate having a first sacrificial material layer deposited over a first metallization layer;

FIG. 3B illustrates an etching step that is used to define a first set of via holes used to construct a first set of supporting pillars;

FIG. 3C illustrates a first oxide layer that is deposited over the first sacrificial material layer and first set of via holes defined in FIG. 3B;

FIG. 3D illustrates the step of defining a first via hole to provide electrical conduction between successive layers;

FIG. 3E illustrates a conductive plug used to fill the first via hole defined in FIG. 3D, and a second patterned metallization layer;

FIG. 3F illustrates the structure of FIG. 3E having a second sacrificial material layer deposited over the second patterned metallization layer and at least some of the first sacrificial material layer;

FIG. 3G illustrates an etch step that is used to define a second set of via holes used to construct a second set of supporting pillars;

FIG. 3H illustrates a second oxide layer that is deposited over the second sacrificial material layer and the second set of via holes defined in FIG. 3G;

FIG. 3I illustrates the step of defining a second via hole to provide electrical conduction between successive layers;

FIG. 3J illustrates a conductive plug used to fill the first via hole defined in FIG. 3I, and a third patterned metallization layer;

FIG. 3K illustrates the step of forming a passivation layer over the entire top surface of the structure illustrated in FIG. 3J;

DETAILED DESCRIPTION OF THE PREFERRED EMBODIMENTS

Figure 1A:
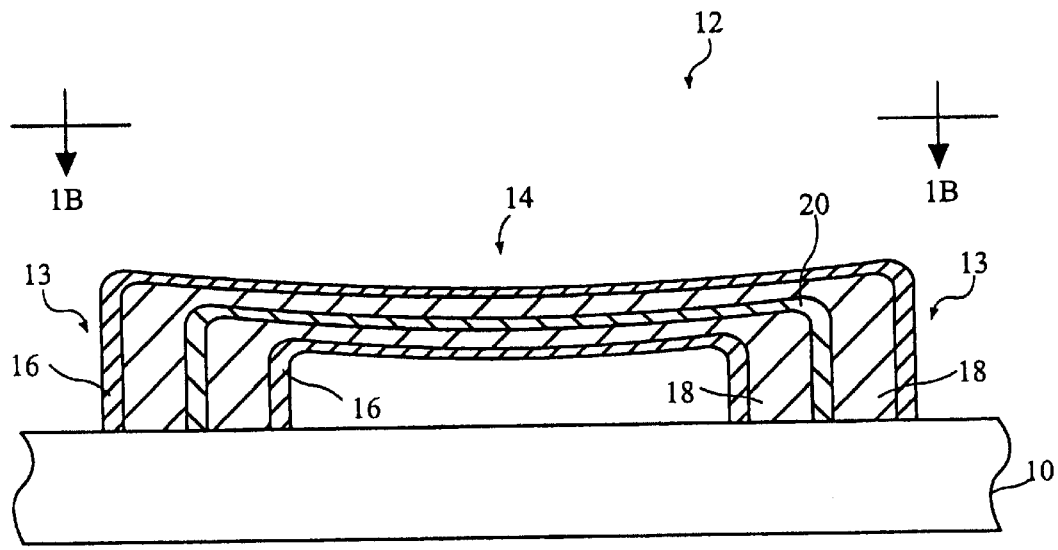
FIG. 1A is a cross-sectional view of a prior art interconnect structure.
Figure 1B:
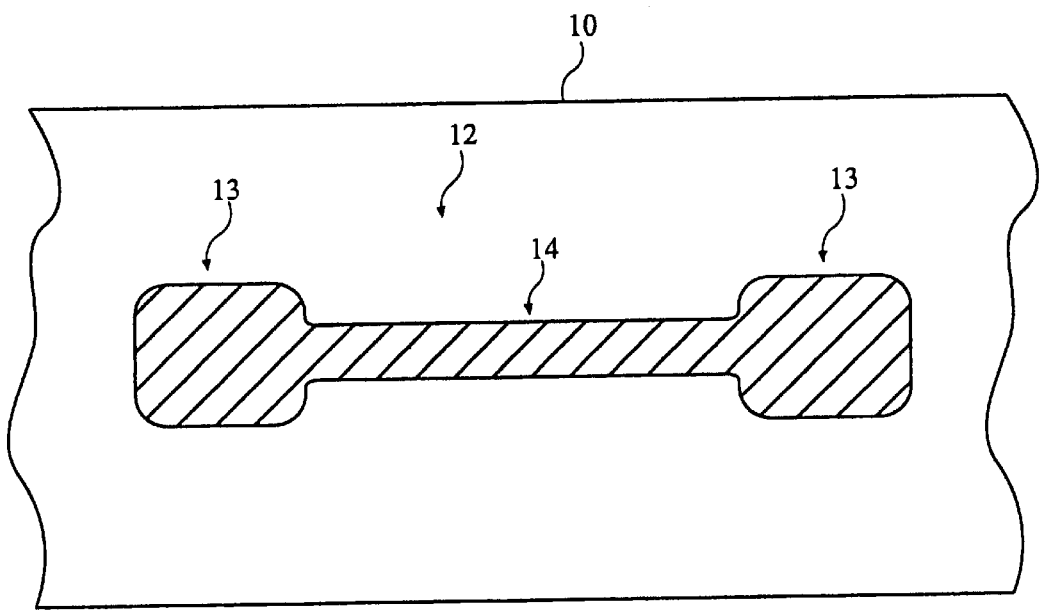
FIG. 1B is a top view of the prior art interconnect structure taken along line 1B—1B of FIG. 1A.
Figure 2:
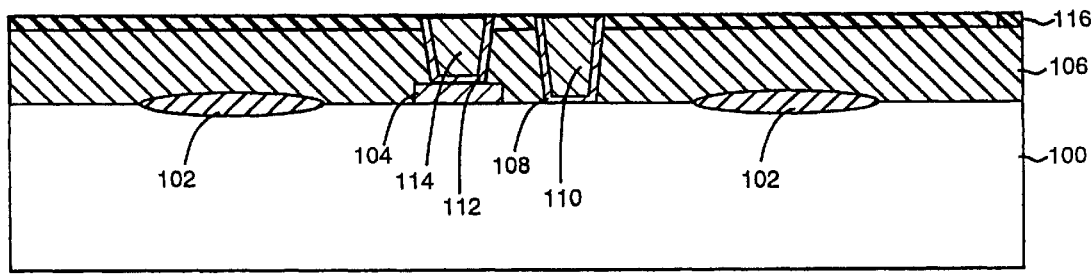
FIG. 2 is a cross-sectional view of a semiconductor substrate having multiple conductive and dielectric layers in accordance with one embodiment of the present invention.

FIGS. 1A and 1B were described with reference to the prior art. In FIG. 2, a cross-sectional view of a multi-layer semiconductor substrate shows a silicon substrate 100. As is well known in the art, substrate 100 may have a multiplicity of p-type or n-type diffusion regions (not shown for ease of illustration). In order to isolate the multiplicity of diffusion regions, field oxide regions 102 are selectively grown. As shown, field oxide regions 102 are generally extend vertically higher than silicon substrate 100. In one embodiment, a patterned polysilicon layer may be formed over silicon substrate 100 and field oxide regions 102. By way of example, a polysilicon segment 104 may define a transistor gate or device interconnection.

The next layer is a dielectric layer 106 which may consist of a silicon oxide ($SiO_2$) layer. After dielectric layer 106 has been deposited, a suitable passivation layer 116 is applied over the top surface of dielectric layer 106. By way of example, suitable passivation materials may include a silicon nitride (SiN) or borophosphosilicate glass (BPSG) layer. In this embodiment, the passivation layer is intended to provide a protective barrier to moisture that may cause corrosion or contaminants to reach silicon substrate 100. Once passivation layer 116 has been deposited, a photoresist layer is spin coated over the top surface of passivation layer 116. A photolithography contact mask is then used to selectively expose photoresist regions where via hole etching is desired.

The via holes are then etched using any suitable etching process. By way of example, suitable via hole etching processes may include an isotropic wet etch or a dry plasma etching processes such as reactive ion etching (RIE). Once the via holes have been etched, a diffusion barrier layer 112 and 108 (sometimes referred to as a "glue" layer) made of a material such as a titanium nitride (TiN) is formed in the via holes. In some cases, the TiN layer serves to protect device elements adjacent the via holes from ingress of metal atoms from a subsequently deposited metallization layer. The TiN barrier layer may be formed by any suitable process. By way of example, one suitable process may include a sputtering technique or chemical vapor deposition (CVD) followed by a rapid thermal processing (RTP) or furnace heating. In some cases, a titanium tungsten (TiW) or a tantalum silicon nitride(Ta—Si—N) barrier layer may be substituted for the TiN barrier layer. In this embodiment, once the via holes are coated with an appropriate barrier layer, a tungsten material 114 and 110 is used to fill the remaining void in the via hole, thereby creating tungsten plug structures.

In this manner, electrical conduction (i.e., interconnection) may be established between metallization layers. In this example, the via hole filled with barrier layer 112 and tungsten material 114 may be used to establish electrical interconnection with a previously formed polysilicon segment 104 and a subsequently formed metallization line. Similarly, the via hole filled with barrier layer 108 and tungsten material 110 may provide electrical conduction between a diffused source or drain (not shown for ease of illustration) and a subsequently formed metalliztion line. As described above, the subsequently formed metallization lines define a first level of interconnect lines.

In an alternative embodiment, once a suitable barrier layer such as barrier layers 112 and 108 have been deposited to coat the via holes, the metallization material used to form the metallization lines (typically aluminum) may be directly applied over barrier layers 112 and 108 to conformally fill the via holes without implementing tungsten plugs. As is well known in the art, this contact fill process is referred to as "aluminum plug fill" and is typically carried out under a high temperature and pressure condition.

Figure 3A:
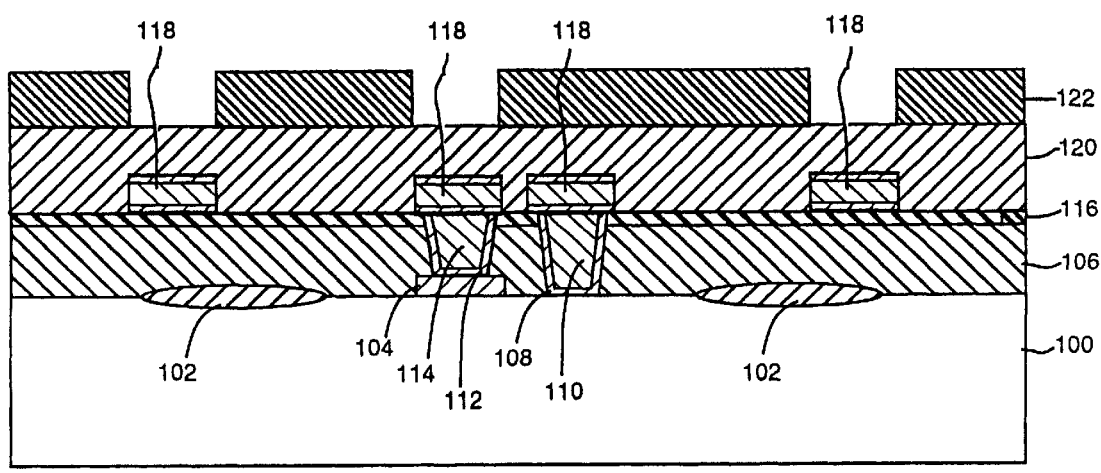
FIGS. 3A–3K illustrate sequential steps of the present invention for making an interconnect structure where.

FIG. 3A, shows a first metallization layer 118 formed and patterned over passivation layer 116 and conductive via holes. In this manner, electrical conduction may be established between first metallization layer 118 and selected underlying devices. First metallization layer 118 may consist of any known conductive material suitable for semiconductor processing. By way of example, one suitable metallization material may consist of between about 96% and 100% aluminum (Al), with the remainder being copper (Cu). Preferably, in one embodiment, a suitable metallization layer may consist of about 99.5% Al and about 0.5% Cu.

In this embodiment, a percentage of Cu is added in order to reduce the metallization layer's electromigration resistance. In some cases, materials such as pure gold (Au) or pure Cu may be substituted for the (Al/Cu) combination. For more information on interconnect delays, reference may be made to a paper entitled "Analysis of the Effects of Scaling on Interconnect Delay in ULSI Circuits" By S. Bothra et al., IEEE Transactions on Electronic Devices, Vol. 40, No.3, pages 591–597, March (1993), incorporated herein by reference.

In one embodiment, metallization layer 118 will be formed in a three step process in order to form a TiN—Al/Cu—TiN sandwich metallization layer. A preferred thickness for metallization layer 118 is approximately between about 0.5 $\mu$m and 1.5 $\mu$m. Most preferably, metallization layer 118 will be approximately 0.8 $\mu$m. Once a suitable metallization layer has been formed, a masking and etching step is performed to establish the metallization line patterns.

By way of example, a suitable etching process may include a reactive ion etching (RIE) process.

After metallization patterning, a sacrificial material is applied over metallization layer 118 and regions of having passivation layer 116. As will be described in greater detail below, the sacrificial material may be any material that may be selectively removed during a final wet etching step. In this embodiment, the sacrificial material was selected to be a sacrificial oxide 120 that can be selectively removed without removing silicon oxide, barrier layers or metallization layers.

By way of example, preferred sacrificial oxides may include Fox-15™ flowable oxide made available by Dow Corning Corporation, of Auburn, Mich. and T-10™ hydrogen silicate glass made available by Tokyo Ohka Kogyo Co. Ltd., of Tokyo, Japan. Preferably, sacrificial oxide 120 will be applied using a spin on glass process. A suitable thickness for sacrificial oxide 120 may be between about 0.5 $\mu$m and 1.5 $\mu$m. Most preferably, the thickness of sacrificial oxide 120 will be about 1.0 $\mu$m. Once the application of sacrificial oxide 120 is complete, a photoresist pillar mask 122 is defined over sacrificial oxide 120.

Figure 3B:
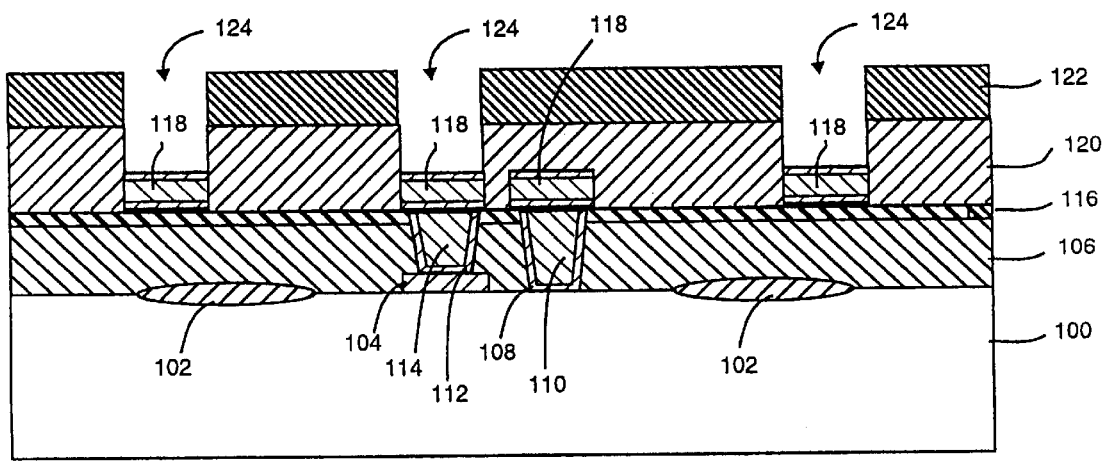

FIG. 3B shows a set of via holes 124 that result from an etching step performed using photoresist pillar mask 122. As will be described in greater detail below, support pillars may include both layers of oxide and metallization such that the support pillars provide mechanical support to successive metallization layers when the sacrificial oxide regions are selectively etched away. In this embodiment, first metallization layer 118 was patterned to leave dummy metallization regions where interconnect mechanical support pillars will ultimately reside. In this embodiment, the dummy metallization regions are used to reduce fabrication complexities associated with etching unnecessarily deep via holes and to improve mechanical support to any supported structures. However, it should be understood that via holes 124 may alternatively extend down to passivation layer 116 without implementing dummy metallization regions.

Figure 3C:
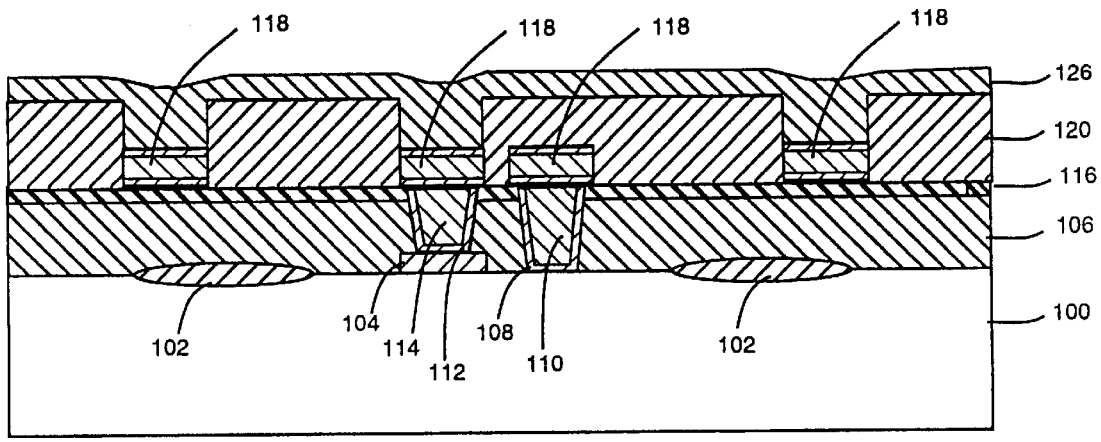

Reference is now drawn to FIG. 3C where any suitable gap filling oxide material is applied over sacrificial oxide 120 and via holes 124. The gap filling oxide may be applied by any number of suitable deposition processes. By way of example, a gap filling oxide 126 may be applied using a high density plasma (HDP) chemical vapor deposition (CVD) or a sub-atmospheric chemical vapor deposition (SACVD). As illustrated in FIG. 3C, gap filling oxide 126 has conformally filled via holes 124 extending down to dummy metallization layer 118. In addition, a layer of gap filling oxide 126 remains over sacrificial oxide 120 leaving slight depressions over via holes 124 of FIG. 3B.

Following the gap filling oxide deposition, a planarization step is performed. Any suitable planarization process may be used to remove the excess gap filling oxide overlying sacrificial oxide 120. By way of example, such planarization processes may include chemical mechanical polishing (CMP), spin-on-glass (SOG) etchback or resist etchback. In this embodiment, a CMP process is used to planarize gap filling oxide 126. The CMP process generally involves the use of a polishing pad made from a synthetic material, such as polyurethane, and a polishing slurry which includes pH-balanced chemicals, such as sodium hydroxide, and silicon dioxide particles. A wafer having gap filling oxide 126 as a top surface is then mounted on a polishing fixture such that the wafer is held by a vacuum and then pressed against the polishing pad under high pressure. The polishing fixture then rotates and translates the wafers relative to the polishing pad. In this manner, the polishing slurry assists in the actual polishing of the wafer surface.

Figure 3D:
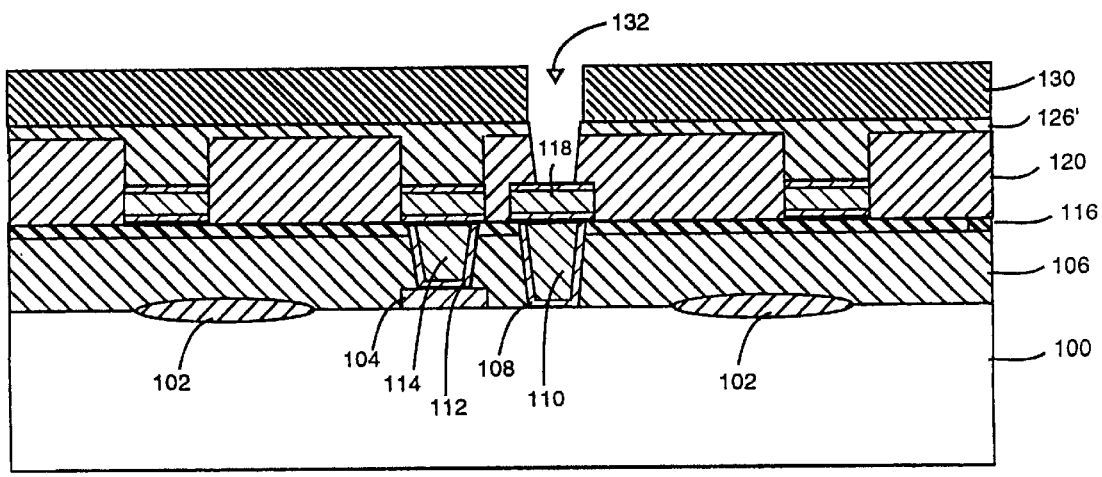

The planarized wafer will then have a thin layer of gap filling oxide 126' remaining over sacrificial oxide 120 as shown in FIG. 3D. Preferably, the thin layer of gap filling oxide 126' is between about 0 and 1500 Å. Next, a patterned photoresist mask 130 is applied over gap filling oxide 126' to form a via hole 132 to an underlying first metallization layer 118.

Figure 3E:
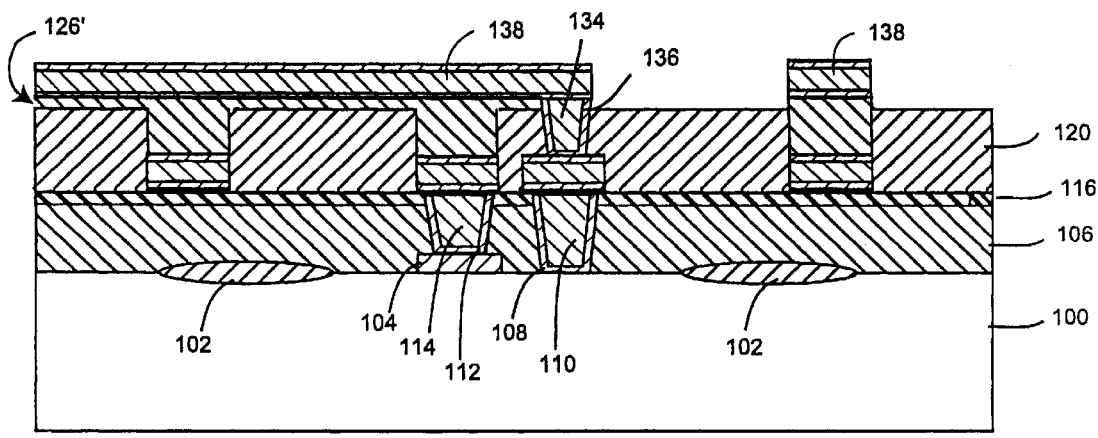

Once via hole 132 has been etched using any conventional etching technique, and photoresist mask 130 is removed, any suitable conductive material may be deposited into via hole 132. In one embodiment, a titanium nitride (TiN) layer 136 first coats the inner walls of via hole 132 such that conductive contact is established with first metallization layer 118. As described above, a tungsten (W) material 134 then conformally fills via hole 132 such that electrical conduction may be established between first metallization layer 118 and a second metallization layer 138 of FIG. 3E. In this embodiment, tungsten material 134 applied using a W deposition process, and the excess removed using a plasma etch or CMP process.

Second metallization layer 138 can be applied as an unpatterned layer in direct contact with gap filling oxide 126' and conductively filled via hole 132. Metallization layer 138 is therefore illustrated after a masking and etching step. In addition, the etch time was selected so as to selectively remove any planarized gap filling oxide 126' lying over the surface of sacrificial oxide 120. In this manner, when gap filling oxide 126' is removed, there will be at least one region where the sacrificial oxide of one layer is in contact with the sacrificial oxide of subsequently formed layers. As will be described in greater detail below, providing at least one region where the sacrificial oxide of successive layers is in contact with each other will enable the selective removal of substantially all layers of sacrificial oxide during a final isotropic etching step.

Figure 3F:
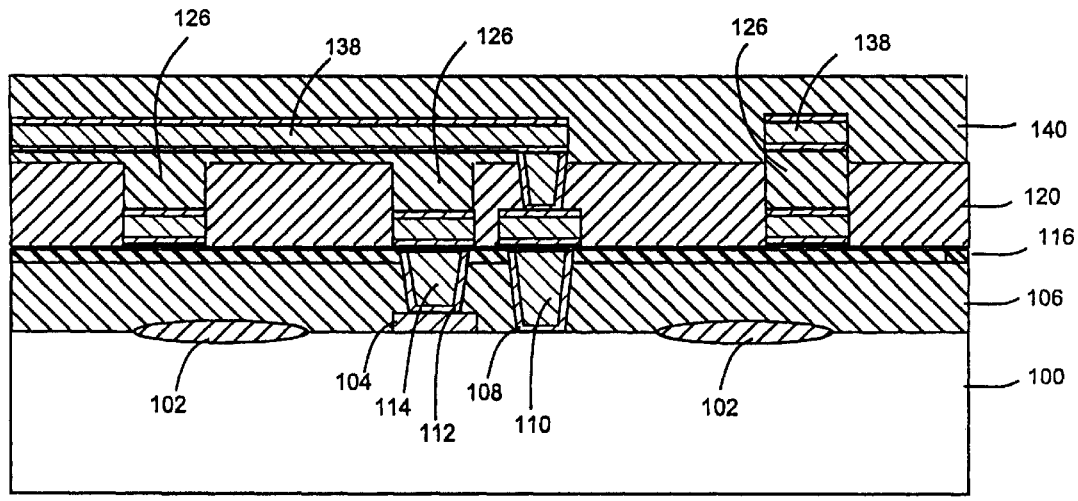
Figure 3G:
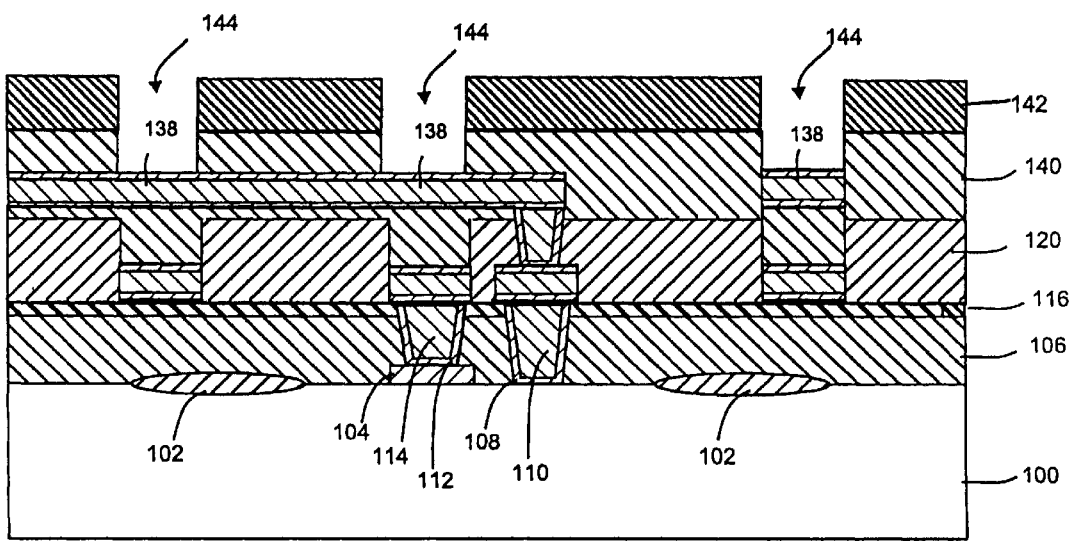

Reference is now drawn to FIG. 3F where a second sacrificial oxide layer 140 is deposited in direct contact with second metallization layer 138 and the top surface of sacrificial oxide 120. Sacrificial oxide layer 140 will preferably have substantially identical properties as sacrificial oxide 120 as well as having an approximate thickness of between about 0.5 μm and 1.5 μm. Turning now to FIG. 3G, a patterned photoresist layer 142 is shown having openings suitable to etch via holes 144 down through sacrificial oxide 140 to second metallization layer 138. As mentioned above, via holes 144 are used to form the pillar support for the multiple layers of patterned metallization lines once the sacrificial oxide layers are etched away. At this point, patterned photoresist layer 142 is removed using convention methods.

Figure 3H:
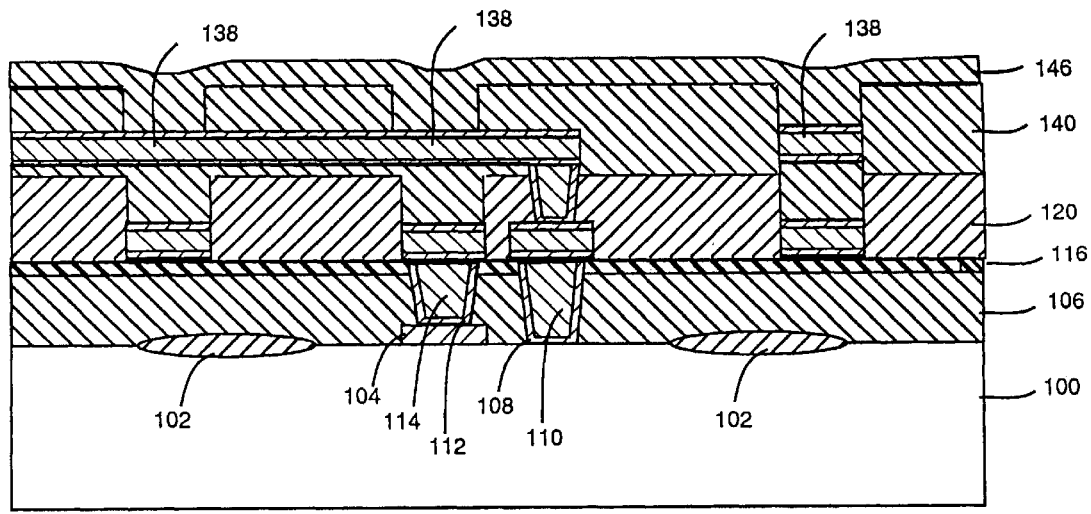

In FIG. 3H, a second gap filling oxide 146 is deposited over second sacrificial oxide layer 140 and into via holes 144 which extend down to second metallization layer 138. As described above, gap filling oxides may be applied by any number of suitable deposition techniques such as high density plasma (HDP) chemical vapor deposition (CVD) or a sub-atmospheric chemical vapor deposition (SACVD). Next, second gap filling oxide 146 is planarized using any number of suitable techniques. As described above, a preferred technique used for the planarization step is chemical mechanical planarization (CMP).

Figure 3I:
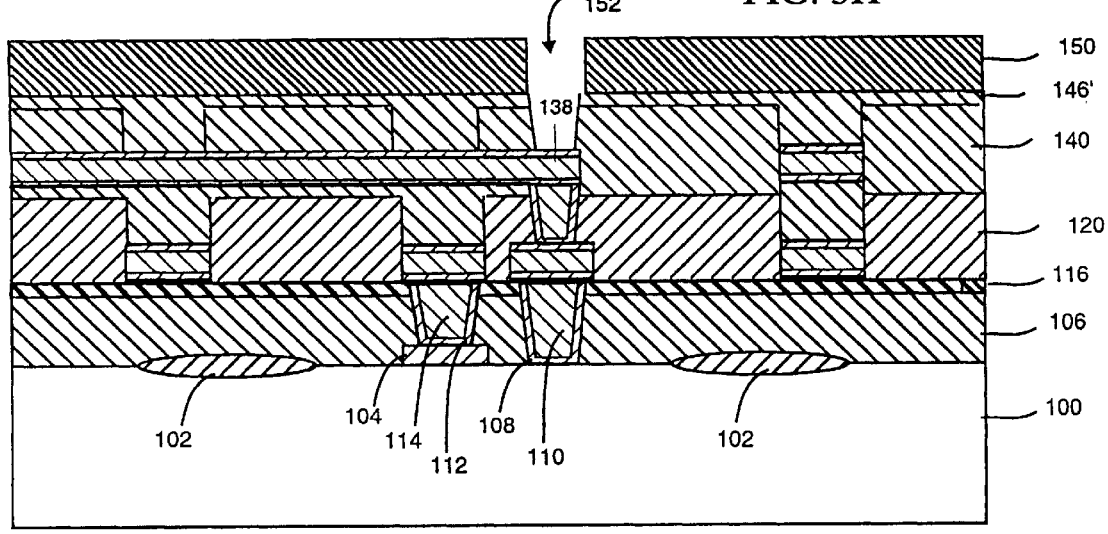

Referring now to FIG. 3I, the resulting planarized second gap filling oxide 146 is shown as a thin layer of gap filling oxide 146'. Also shown is a patterned photoresist layer 150 having an opening suitable for etching a via hole 152 down to second metallization layer 138. As previously described, via hole 152 is designed to provide electrical conduction between interconnect metallization layers.

Figure 3J:
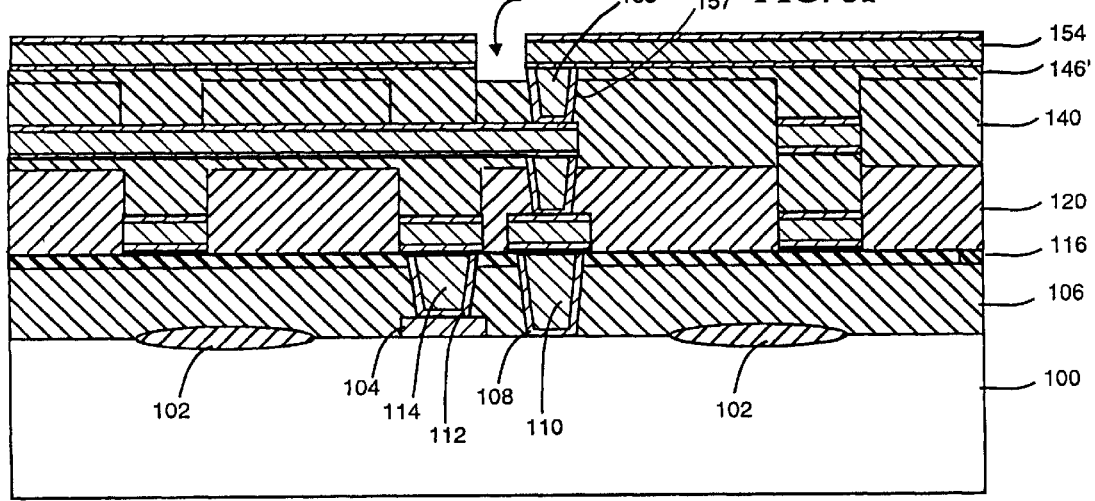

FIG. 3J shows via hole 152 filled with a suitable conductive material. As described above, a barrier layer 157 is first deposited around the inner via hole walls, and then a conductive tungsten plug 155 fills the remaining via hole cavity using W deposition. The excess W is then removed using any suitable etchback process. Also shown is a third patterned metallization layer 154 overlying gap filler oxide 146' and in direct contact with the conductively filled via hole 152. As in previous layers, the filling oxide 146' is removed over a region 156 during the metallization etching step.

Figure 3K:
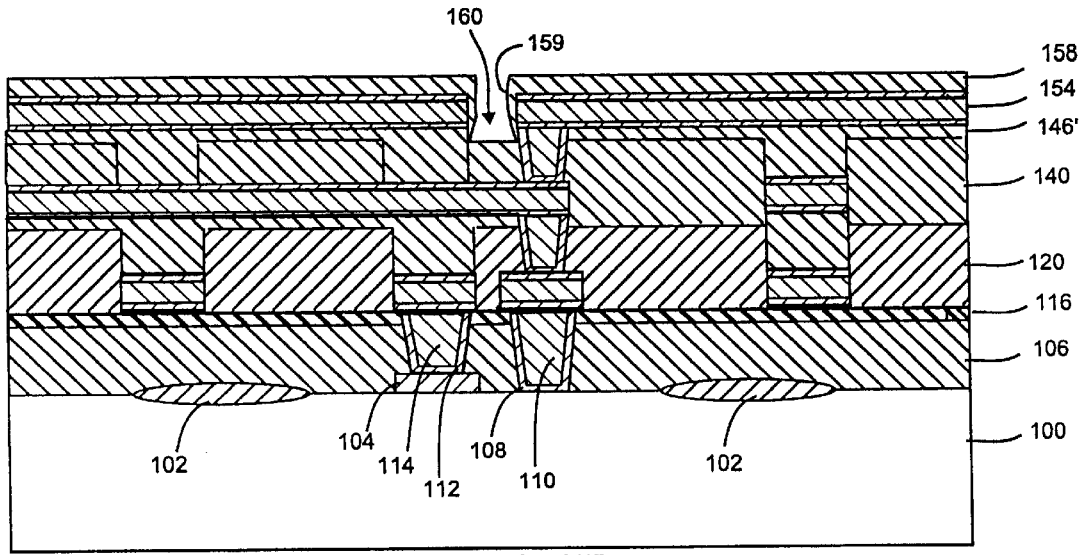

Reference is now drawn to FIG. 3K where a passivation layer 158 is applied over third metallization layer 154. As described above, passivation layer 158 may be any suitable passivation material. Preferably, passivation layer 158 is a silicon nitride (SiN) material that is designed to adhere to side walls 159 of third metallization layer 154. In this manner, side walls 159 are protected from ambient conditions such as moisture which may cause corrosion. At this point, a photoresist mask is applied over the entire substrate in order to etch a window 160 in passivation layer 158. This final masking and etching step is of critical importance in order to assure that at least one pathway remains exposing the sacrificial oxide layers. Although only a cross-sectional view has been presented, it should be understood that in a three dimensional substrate, there will be at least one or more regions where sacrificial oxide material is exposed.

Figure 4:
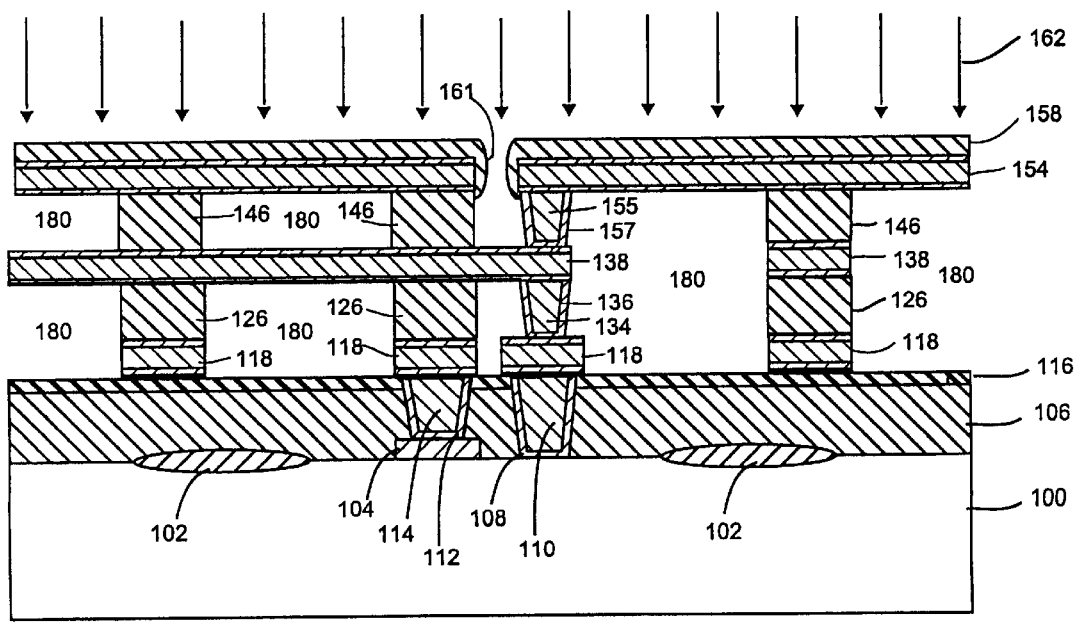
FIG. 4 illustrates the step of subjecting the resulting integrated circuit to an isotropic etchant to selectively remove the deposited sacrificial material layers leaving an interconnect structure having air as a dielectric.

FIG. 4 illustrates one embodiment of a completed interconnect structure having air as a dielectric. By way of example, regions 180 are located where sacrificial oxide layers once resided. The sacrificial oxide layers were removed by subjecting the interconnect structure to an isotropic etchant 162 for a period of time ranging between about 1 and 10 minutes. Suitable isotropic etchants 162 include a diluted hydrofluoric (HF) acid, buffered oxide etch (HF, NH$_3$F), and neutral oxide etch (glycol, NH$_3$F). Suitable pH for the isotropic etchants is generally in the range of about 2–6.

Due to the chemical properties associated with the sacrificial oxides, isotropic etchant 162 will preferably not substantially etch away at the metallization layers, protective barrier layers and filler oxide pillar structures. As can be appreciated, the pillar structures provide essential mechanical support to the various metallization layers to prevent the aforementioned sagging or breakage associated with prior art interconnect structures. It should be understood that if other suitable sacrificial materials are substituted for sacrificial oxides 120 and 140, a different isotropic etchants might be used that selectively etch those sacrificial materials. The resulting interconnect structure of FIG. 4 therefore provides an interconnect structures having "air" as a dielectric, which results in increased interconnect speed.

Further, as interconnect design rules continue to shrink, the physical spacing between interconnect lines will also shrink. Therefore, in one embodiment, the resulting air dielectric will also have the beneficial effect of decreasing the likelihood of cross-talk between interconnect metallization lines (i.e., cross coupling).

Figure 5:
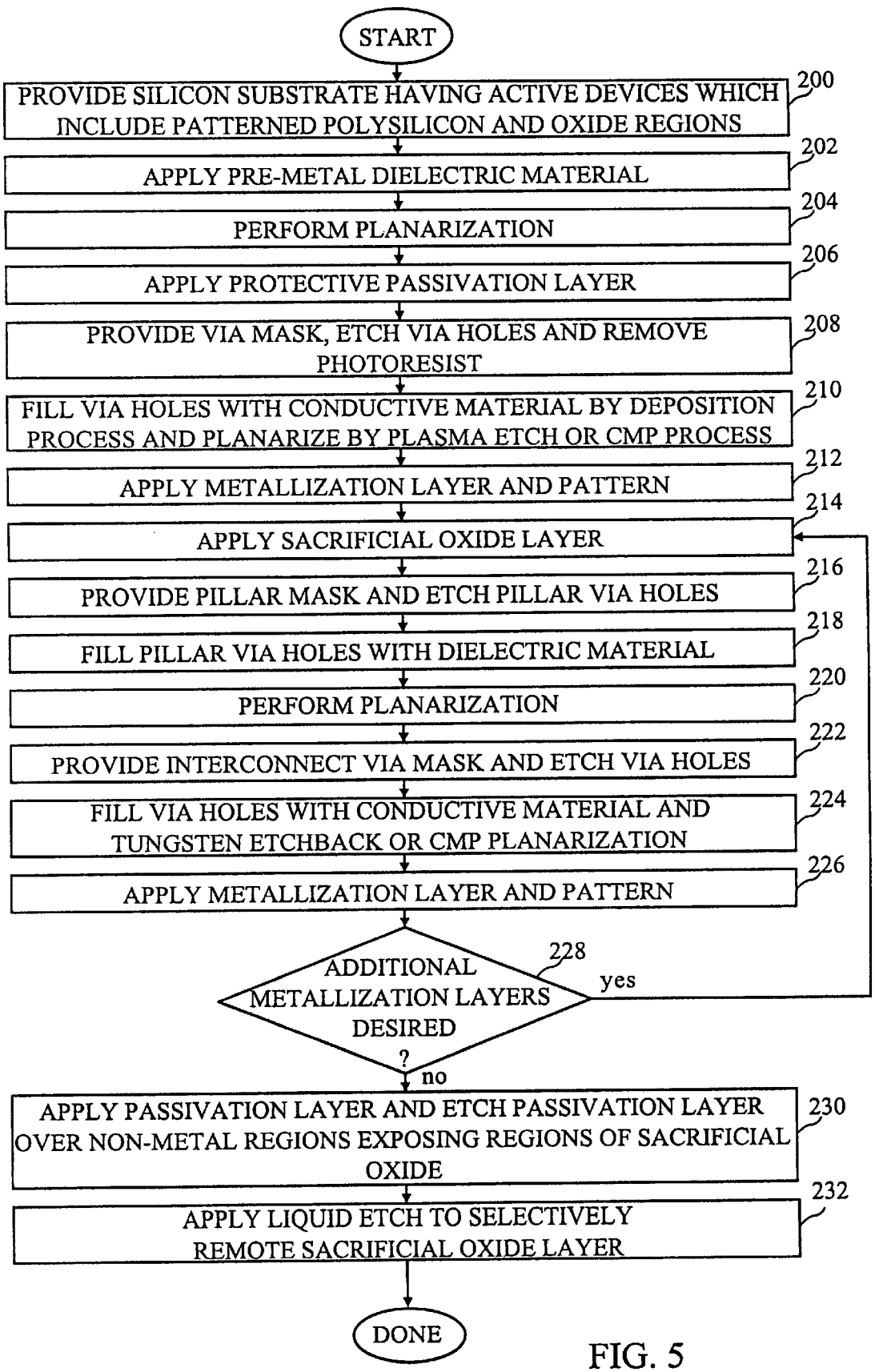
FIG. 5 is a flow diagram of the process flow associated with fabricating an interconnect structure having air as a dielectric.

The above-described manufacturing steps may be further understood with reference to a flowchart presented in FIG. 5. FIG. 5 starts at a step 200 where a silicon substrate typically having a multiplicity of active devices (e.g., transistors) is provided. Once the desired substrate has been provided in step 200, the method proceeds to a step 202 where a dielectric material is applied over the substrate described in step 200. As described above, the dielectric material may be a $SiO_2$ or doped $SiO_2$ with borophosphosilicate glass (BPSG) dielectric designed to isolate the multiplicity of active devices, polysilicon lines and oxide regions from subsequently formed metallization layers.

The method then proceeds to a step 204 where the dielectric material applied in step 202 is planarized. As described above, the planarizing step may be accomplished by employing any number of suitable planarization processes. In this embodiment, the preferred planarization process may be chemical mechanical polishing (CMP). Once the planarization step is complete; the dielectric layer material applied in step 202 will manifest a more even topology.

After the planarization step of step 204 is complete, the method proceeds with a step 206 where a protective passivation layer is applied over the dielectric layer applied in step 202 surface. As described above, a suitable passivation layer may include a silicon nitride layer (SiN). The passivation layer is intended to protect the underlying substrate surface from contaminants. By way of example, passivation layer is typically a good barrier to moisture which may cause circuit corrupting corrosion. Once the passivation layer has been applied in step 206, the method proceeds to a step 208 where a patterned photoresist via mask is provided over the protective passivation layer described in step 206. In this manner, regions intended for via holes are left unprotected with photoresist during the etching step.

The via holes are then etched to create contact holes down to preselected regions on the substrate provided in step 200 and the photoresist mask is removed. By way of example, in this embodiment, the via holes are intended to establish a link between preselected transistor drains, sources, gates or polysilicon lines located at the substrate level (i.e., below the isolating dielectric layer). The method then proceeds with a step 210 where the via holes are filled with a suitable conductive material in order to provide appropriate interconnection with subsequently formed metal interconnect lines. As discussed above, one suitable method of filling conductive via holes is to conformally apply a thin titanium nitride (TiN) layer and then fill the rest of the via hole void is filled with a tungsten deposition. The excess tungsten material is then removed using a plasma etch or CMP process.

Once the via holes have been filled in step 210, the method proceeds to a step 212 where a metallization layer is applied over the passivation layer such that sections of the metallization layer are in direct electrical contact with the conductively filled via holes described in step 210. As mentioned above, a suitable metallization layer will be one having a TiN—(Al—Cu)—TiN sandwich structure. The metallization layer is then patterned using conventional photolithography processes. At this stage, the patterned metallization layer will have regions in direct electrical contact with the conductively filled via holes. In addition, as mentioned above, dummy segments of metallization may also be patterned throughout the metallization layer to form part of the interconnect pillar supports.

The method then proceeds with a step 214 where a sacrificial oxide layer is applied over the patterned metallization layer described in step 212, as well as portions of the passivation layer applied in step 206 not covered by metallization. From step 214, the method proceeds with a step 216 where a photoresist pillar mask is applied over the sacrificial oxide layer. As described above, pillars are used to provide mechanical support to the metallization layers that make up the interconnect structure when the sacrificial oxide is etched away. Once the photoresist pillar mask has been applied, the pillar via holes are etched leaving a direct path down to either a dummy metallization segment, or the underlying protective passivation layer described in step 206. The photoresist pillar mask is then removed.

The method then proceeds with a step 218 where the pillar via holes are filled with a dielectric material (e.g., $SiO_2$). In this embodiment, the dielectric material is intended to define part of the final pillar supports as were the dummy metallization segments. Consequently, the dielectric material selected to fill the via pillar holes will be one that is resistant to an isotopic etchant used to remove the sacrificial oxide material.

Once the pillar via holes have been filled with a suitable dielectric material in step 218, the method proceeds to a step 220 where a planarization step is performed. As mentioned above, although any suitable planarization technique may be used, CMP planarization will be used in step 220. The planarization step is intended to remove excess dielectric material resulting from the dielectric deposited in step 218 In this manner, the planarization step will leave a dielectric film not having a thickness greater than about 2000 Å. More preferably, the dielectric film will not have a thickness greater than about 1500 Å. This approximate maximum thickness is selected in order to facilitate the removal of any oxide material remaining over the sacrificial oxide when successive metallization layers are patterned (e.g., the etching step used to pattern the metallization will also remove the underlying film of dielectric material). The method then proceed to a step 222 where an interconnect via mask is provided. As described above, the via holes are then etched using conventional etching processes. The interconnect via holes are generally intended to provide electrical conduction between regions on the silicon substrate and subsequent metallization layers.

The method then proceeds to a step 224 where the via holes are filled with an appropriate conductive material as described above. Once the via holes have been filled with a conductive material, the method proceeds to a step 226 where a metallization layer is applied and then patterned, using conventional photolithography and etching processes. The method will then proceed to a decision step 228 where it is determined whether additional metallization layers are desired. It should be understood that any number of metallization layers may be formed depending on the application. Therefore, if an additional metallization layer is desired in decision step 228, the method will again proceed through steps 214 to 226 where a second metallization interconnect layer is formed. The method will then continue forming metallization interconnect layers until it is determined that no more metallization layers are desired in step 228.

The method will then proceeds with a step 230 where a passivation layer is applied over the top surface, which includes the previously pattern metallization layer and exposed regions of sacrificial oxide. Next, a masking step follows where passivation regions lying over the sacrificial oxide are etched away. Therefore, there will be at least one opening down to the sacrificial oxide material.

The method then proceeds with a step 232 where a liquid etchant is applied over the entire integrated circuit in order to selectively remove the resulting layers of sacrificial oxide. As described above, if more than one layer of sacrificial oxide is present, at least one segment of sacrificial oxide will be in contact with sacrificial oxide in other layers such that a pathway is provided for the liquid etchant. Further, the liquid etchant is chosen such that only the sacrificial oxide is selectively removed.

The resulting interconnect structure therefore provides oxide and dummy metallization pillars for mechanically supporting successive metallization lines, and "air" as the effective dielectric between metallization lines. As can be appreciated, the resulting air dielectric interconnect structure will be sufficiently supported by the strategically placed pillar structures and interconnect structure capacitance will be lower than conventional oxides or organic materials (i.e., producing lower RC delays). Consequently, once the sacrificial oxide has been removed in step 232, the method will be complete for one air dielectric interconnect structure.

While this invention has been described in terms of several preferred embodiments, there are alterations, permutations, and equivalents which fall within the scope of this invention. It should also be noted that there are may alternative ways of implementing both the process and apparatus of the present invention. For example, it may be desirable to form a protective passivation layer over each patterned metallization layer. A suitable passivation layer may include a thin oxide layer deposited using a plasma enhanced chemical vapor deposition (PECVD) process. In this manner, substantially all of the metallization lines (on the various interconnect layers) are provided with a protective passivation layer to reduce the likelihood of metallization corrosion or damage.

It is therefore intended that the following appended claims be interpreted as including all such alterations, permutations, and equivalents as fall within the true spirit and scope of the present invention.

What is claimed is:

1. A method for making an integrated circuit structure with air dielectric comprising the steps of:

preparing a substrate;

forming an air dielectric formation layer over said substrate, said air dielectric formation layer having a bottom surface in contact with said substrate and having a top surface, said air dielectric formation layer including sacrificial material extending between said bottom surface and said top surface and an insulating non-sacrificial material extending between said bottom surface and said top surface;

forming a supported layer over said air dielectric formation layer having a bottom surface and a top surface, said bottom surface of said supported layer being in contact with said top surface of said air dielectric formation layer, said supported layer having at least one aperture extending therethrough from its bottom surface to its top surface such that there is at least one path through said supported layer to said substrate through said sacrificial material; and removing at least some of said sacrificial material through said at least one aperture with an isotropic etchant, thereby creating at least one air dielectric region where said sacrificial material is removed and at least one pillar of said insulating non-sacrificial material below said supported layer, whereby said supported layer is at least partially supported by said at least one pillar;

wherein said supported layer includes a patterned metallization layer such that at least one segment of said patterned metallization layer forms a dummy metallization line that defines at least part of said at least one pillar.

2. A method for making an integrated circuit as recited in claim 1, wherein said air dielectric formation layer is a first air dielectric formation layer, and wherein said supported layer is a first supported layer, said first air dielectric formation layer and said first supported layer forming a first air dielectric structure, and further comprising at least one additional air dielectric structure formed above said first air dielectric structure such that there is at least one path through a topmost air dielectric structure to said substrate through said sacrificial material of each of said air dielectric structures.

3. A method for making an integrated circuit as recited in claim 2, further comprising the step of forming a passivation barrier layer between said substrate and said first air dielectric structure.

4. A method for making an integrated circuit as recited in claim 3 wherein said passivation layer comprises silicon nitride.

5. A method for making an integrated circuit as recited in claim 2, wherein said insulating non-sacrificial material is deposited over and in pillar holes of said first air dielectric formation layer to provide the insulating non-sacrificial material for said at least one pillar.

6. A method for making an integrated circuit as recited in claim 5, wherein the step of forming said supported layer comprises:

forming a metal layer; and patterning said metal layer to remove said metal layer and said insulating non-sacrificial material not in the pillar holes from over said first air dielectric formation layer, thereby forming a patterned supported layer.

7. A method for making an integrated circuit as recited in claim 6, further comprising the steps of:

applying a passivation layer over said topmost air dielectric structure; and removing said passivation layer over said air dielectric formation layer not covered with said patterned supported layer.

8. A method for making an integrated circuit as recited in claim 2, wherein conductive vias are provided through said air dielectric formation layers to establish electrical conduction between selected regions on said substrate and selected ones of said supported layers.

9. A method for making an integrated circuit as recited in claim 1, wherein the step of forming said supported layer further comprises the substeps of:

depositing a bottom conductive barrier layer;

depositing center conductive layer; and depositing a top conductive barrier layer.

10. A method for making an integrated circuit as recited in claim 9 wherein said bottom conductive layer comprises TiN, said center conductive layer comprises Al, and said top conductive layer comprises TiN.

11. A method for making an integrated circuit as recited in claim 1, wherein said sacrificial material is selected from the group consisting essentially of Fox-15 flowable oxide and T-10 hydrogen silicate glass, and is between 0.5 and 1.5 microns in depth, and wherein the step of removing said sacrificial material includes selecting said isotropic etchant to be an acid selected from the group consisting essentially of hydrofluoric (HF), buffered oxide etch (HF, $NH_3F$) and neutral oxide etch (glycol, $NH_3F$).

12. A method for making an integrated circuit as recited in claim 11 wherein said acid is HF acid having a pH in the range of 2 to 6.

13. A method for making an integrated circuit as recited in claim 12 wherein said HF is applied for a time ranging from about 1 to about 10 minutes.

14. A method of making an air-dielectric interconnect structure for use in semiconductor integrated circuit chips, the method comprising:

(a) forming a substrate including,
  (i) providing a semiconductor substrate having a plurality of active regions including polysilicon transistor gates;
  (ii) depositing an oxide layer over said semiconductor substrate;
  (iii) depositing a passivation layer over the substrate; and
  (iv) defining substrate level conductive vias through said passivation layer and said oxide layer to make electrical contact with selected ones of the plurality of active regions; and
(b) forming the air dielectric interconnect structure over the substrate including,
  (i) forming a first metallization interconnect layer over the passivation layer of substrate to make electrical interconnection with selected ones of the substrate level conductive vias and also defining at least one dummy metallization feature;
  (ii) depositing a sacrificial oxide material over the first metallization interconnect layer;
  (iii) dry etching pillar holes in said sacrificial oxide over the first metallization interconnect layer, including over the at least one dummy metallization feature;
  (iv) filling said pillar holes with a non-sacrificial oxide;
  (v) forming a second metallization interconnect layer over the sacrificial oxide material such that at least one aperture is defined through the second metallization interconnect layer down to the sacrificial oxide material; and
  (vi) subjecting the air dielectric interconnect structure to a wet etch that comes into contact with the sacrificial oxide material by way of the at least one aperture, such that the sacrificial oxide material is removed leaving air dielectric regions and pillar support structures to support the second metallization interconnect layer.

15. A method of making an air-dielectric interconnect structure as recited in claim 14, wherein the forming of the air dielectric interconnect structure over the substrate further comprises:
  dry etching via holes in said sacrificial oxide over the first metallization interconnect layer after performing both the dry etching of (b)(iii) and the filling of (b)(iv); and
  filling the via holes to form additional conductive via holes.

16. A method of making an air-dielectric interconnect structure as recited in claim 14, wherein the pillar support structures are at least partially defined by the non-sacrificial oxide and the first metallization interconnect layer.

17. A method of making an air-dielectric interconnect structure as recited in claim 14, wherein some of the pillar support structures are defined by the non-sacrificial oxide and the at least one dummy metallization feature.

18. A method of making an air-dielectric interconnect structure as recited in claim 14, further comprising:
  fixing a separation between the pillar support structures.

19. A method of making an air-dielectric interconnect structure as recited in claim 14, wherein the sacrificial oxide is selected from the group consisting essentially of Fox-15 flowable oxide and T-10 hydrogen silicate glass.

20. A method of making an air-dielectric interconnect structure as recited in claim 19, wherein the wet etch of (b)(vi) implements a isotropic acid etchant.

21. A method of making an air-dielectric interconnect structure as recited in claim 19, wherein the isotropic acid etchant is selected from the group consisting essentially of hydrofluoric (HF), buffered oxide etch (HF, NH$_3$F), and neutral oxide etch (glycol, NH$_3$F).

22. A method of making an air-dielectric interconnect structure for use in semiconductor integrated circuit chips, the method comprising:
(a) forming a substrate; and
(b) forming the air dielectric interconnect structure over the substrate including,
  (i) forming a first metallization interconnect layer over the substrate that includes at least one dummy metallization feature;
  (ii) depositing a sacrificial oxide material over the first metallization interconnect layer;
  (iii) dry etching pillar holes in said sacrificial oxide over the first metallization interconnect layer, including over the at least one dummy metallization feature;
  (iv) filling said pillar holes with a non-sacrificial oxide;
  (v) forming a second metallization interconnect layer over the sacrificial oxide material such that at least one aperture is defined through the second metallization interconnect layer down to the sacrificial oxide material; and
  (vi) subjecting the air dielectric interconnect structure to a wet etch that comes into contact with the sacrificial oxide material by way of the at least one aperture, such that the sacrificial oxide material is removed leaving air dielectric regions between the first and second metallization interconnect layers, the wet etch further configured to define pillar support structures to support the second metallization interconnect layer, the pillar support structures being at least partially defined by the non-sacrificial oxide.

23. A method of making an air-dielectric interconnect structure as recited in claim 22, wherein the operation (a) of forming of the substrate comprises:
  (i) providing a semiconductor substrate having a plurality of active regions including polysilicon transistor gates;
  (ii) depositing an oxide layer over said semiconductor substrate;
  (iii) depositing a passivation layer over the substrate; and
  (iv) defining substrate level conductive vias through said passivation layer and said oxide layer to make electrical contact with selected ones of the plurality of active regions.

24. A method of making an air-dielectric interconnect structure as recited in claim 22, wherein some of the pillar support structures are defined by the non-sacrificial oxide and the at least one dummy metallization feature.

25. A method of making an air-dielectric interconnect structure as recited in claim 22, further comprising:
  fixing a separation between the pillar support structures.

26. A method of making an air-dielectric interconnect structure as recited in claim 22, wherein the sacrificial oxide is selected from the group consisting essentially of Fox-15 flowable oxide and T-10 hydrogen silicate glass.

27. A method of making an air-dielectric interconnect structure as recited in claim 22, wherein the wet etch of (b)(vi) implements a isotropic acid etchant.

28. A method of making an air-dielectric interconnect structure as recited in claim 27, wherein the isotropic acid etchant is selected from the group consisting essentially of hydrofluoric (HF), buffered oxide etch (HF, NH$_3$F), and neutral oxide etch (glycol, NH$_3$F).

* * * * *

UNITED STATES PATENT AND TRADEMARK OFFICE
CERTIFICATE OF CORRECTION

| | | |
|---|---|---|
| PATENT NO. | : 6,057,224 | Page 1 of 1 |
| APPLICATION NO. | : 08/899531 | |
| DATED | : May 2, 2000 | |
| INVENTOR(S) | : Subhas Bothra et al. | |

It is certified that error appears in the above-identified patent and that said Letters Patent is hereby corrected as shown below:

On the Title Page, at Item [63] Related U.S. Application Data:

Change "Continuation-in-part of application no. 08/623,883, Mar. 29, 1996" to --Division of application no. 08/623,883, Mar. 29, 1996, abandoned--.

Signed and Sealed this

Thirteenth Day of September, 2011

David J. Kappos
*Director of the United States Patent and Trademark Office*